Figure 1:
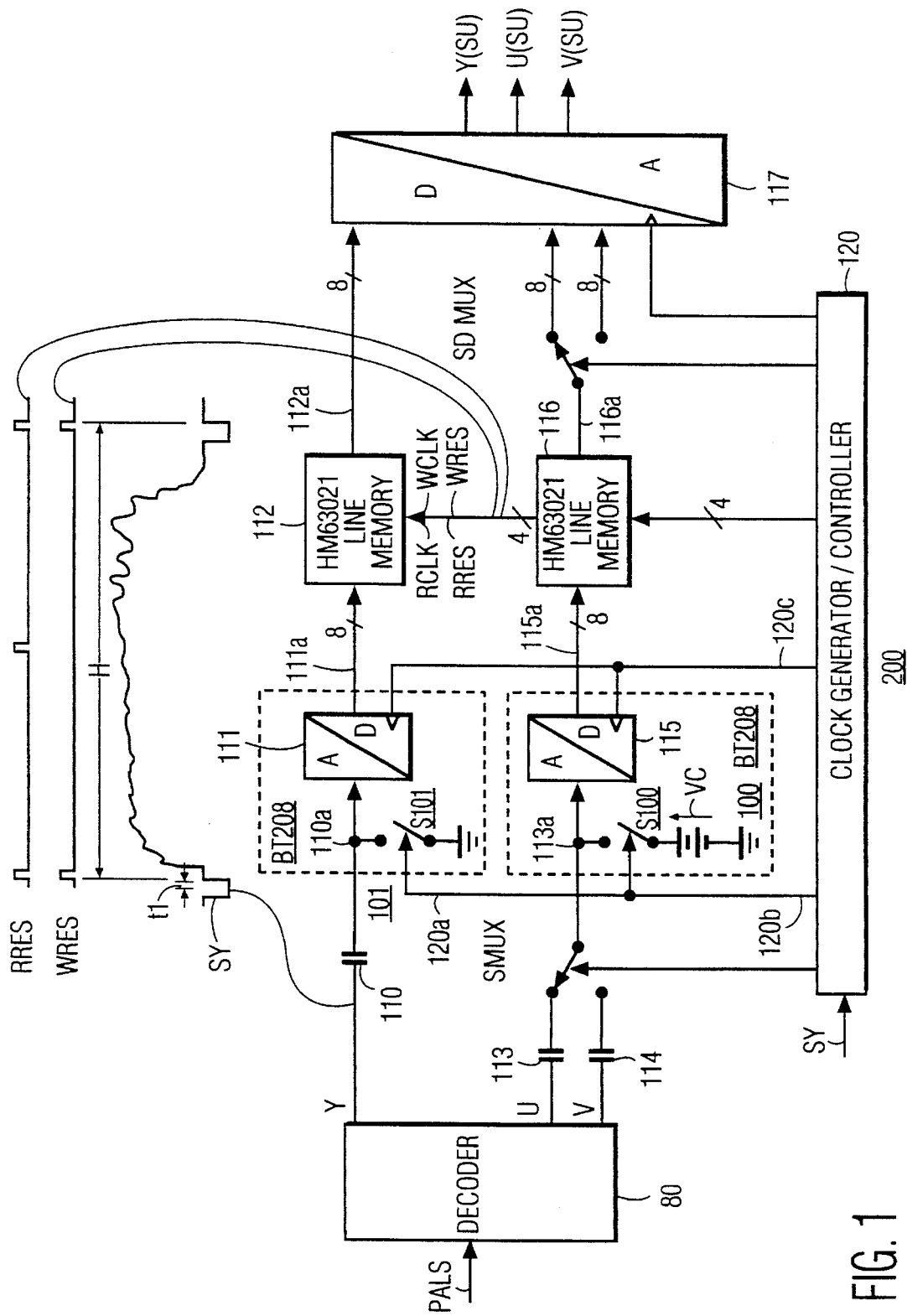

United States Patent [19]

den Hollander

[11] Patent Number: 5,530,487
[45] Date of Patent: Jun. 25, 1996

[54] VIDEO SIGNAL CLAMPING ARRANGEMENT LOCATED DOWNSTREAM OF A MULTIPLEXER

[75] Inventor: Willem den Hollander, Schlieren, Switzerland

[73] Assignee: RCA Thomson Licensing Coporation, Princeton, N.J.

[21] Appl. No.: 380,914

[22] Filed: Jan. 30, 1995

[30] Foreign Application Priority Data

Apr. 7, 1994 [GB] United Kingdom ............... 9406866

[51] Int. Cl.⁶ .............................. H04N 9/72; H04N 11/20
[52] U.S. Cl. ...................................... 348/692; 348/450
[58] Field of Search ................... 348/448, 450, 348/692, 694–695, 689; H04N 11/20, 7/92

[56] References Cited

U.S. PATENT DOCUMENTS

| 4,750,051 | 6/1988 | Kaneko et al. | 348/695 |
| 5,084,700 | 1/1992 | Christopher | 348/689 |
| 5,325,187 | 6/1994 | Kubo et al. | 348/692 |
| 5,345,279 | 9/1994 | Takaiwa et al. | 348/689 |
| 5,371,552 | 12/1994 | Brummette et al. | 348/692 |
| 5,410,357 | 4/1995 | Rieger et al. | 348/448 |
| 5,424,774 | 6/1995 | Takayama et al. | 348/692 |

*Primary Examiner*—Victor R. Kostak
*Attorney, Agent, or Firm*—Joseph S. Tripoli; Joseph J. Laks; Sammy S. Henig

[57] ABSTRACT

Video components U and V are applied to an input of a multiplexer. An output signal of the multiplexer is clamped using a clamper that is common for each of the video signal components. An input of the multiplexer is located upstream of the clamper. The clamped signal is processed through an analog-to-digital converter and applied to a line memory for providing video line doubling.

7 Claims, 1 Drawing Sheet

VIDEO SIGNAL CLAMPING ARRANGEMENT LOCATED DOWNSTREAM OF A MULTIPLEXER

The invention relates to a video signal processor that includes a clamping arrangement.

In order to reduce the visibility of a line structure of a television picture, it is known to double the number of lines in the picture. In such an arrangement, an incoming analog composite baseband video signal may be separated to an analog luminance signal component and analog color signal components. In, for example, the phase alternating line (PAL) system, such analog signal components are referred to as signal components Y, U and V.

Samples of a given signal component may be stored in a line memory. The samples stored in the line memory are read out at double the rate in which they are stored in the memory. Consequently, in each horizontal video line time of the composite baseband video signal, a pair of consecutive video line signal components are produced, each having the same picture information in a compressed or speeded-up manner. The pair of consecutive speeded-up video signal components provide picture information for a pair of scan lines, respectively, in the picture.

Typically, the line memory is of a digital storage type. Therefore, for example, analog color component signals U and V are first converted to digital words in an analog-to-digital (A/D) converter. Then, the digital words are stored in the line memory.

Each of the signal components U and V is a symmetrical signal with respect to its average A/C level. In order to utilize the full input signal range of the A/D converter, the magnitude of the average level of each of signal components U and V is clamped to a level at a mid-range of the input signal range of the A/D converter.

It may be desirable to store alternate samples of signal components U and V in a single line memory using a multiplexer. In this way, a single line memory can be used for speeding up both signal components U and V. It may also be desirable to utilize a single clamper switch for clamping signal components U and V for reducing circuitry complexity.

A video apparatus for generating a multiplexed clamped video signal, embodying an aspect of the invention, includes a source of a composite video signal and a decoder responsive to the composite video signal for generating first and second video signal components that are separated from each other. A multiplexer has an input that is responsive to the video signal components for alternately applying the first and second video signal components to an output of the multiplexer to develop a multiplexed video signal. A clamper is responsive to a clamping signal for clamping a first portion of the multiplexed video signal that is applied from the first video signal component and a second portion of the multiplexed video signal that is applied from the second video signal component. The clamper generates the clamped video signal such that the clamper is located downstream in a signal path relative to the input of the multiplexer.

FIG. 1 illustrates a video signal clamping arrangement, embodying an aspect of the invention, of a video signal line doubler.

FIG. 1 illustrates a video signal clamping arrangement 100, embodying an aspect of the invention, that is used in a video signal line doubler 200. A composite baseband analog video signal PALS, in accordance with the PAL system, is separated to its analog video signal components, Y, U, V in a conventional decoder 80.

Luminance signal component Y is coupled to a conventional clamping arrangement 101. Clamping arrangement 101 includes a coupling capacitor 110 coupled to a switch S101. Switch S101 is controlled by a control signal 120a produced in a conventional clock generator/controller unit 120. The signals that are generated in unit 120 are synchronized to a horizontal sync signal SY.

Switch 101 may be realized using a switching metal oxide semiconductor (MOS) transistor, not shown. Switch S101 develops a constant 0V voltage at a terminal 110a of capacitor 110 when switch S101 is closed. The voltage at terminal 110a is at 0V, during an interval t1, in a vicinity of horizontal sync signal SY. Outside interval t1, switch S101 is open and signal component Y is capacitively coupled via capacitor 110 to terminal 110a. The DC voltage that is developed across capacitor 110, during interval t1, when switch S101 is closed, level shifts signal component Y to provide a clamped signal component Y at terminal 110a.

Signal component Y at a terminal of capacitor 110 that is remote from terminal 110a has a peak-to-peak voltage range of 1V. Clamped analog signal component Y at terminal 110a is applied to an input of an analog-to-digital (A/D) converter 111. As a result of the clamping operation, clamped signal component Y is a positive signal at terminal 110a that varies within an input voltage range, 0V to 1V, of A/D converter 111a. Therefore, advantageously, no signal clipping or distortion occurs in A/D converter 111a.

The rate of signal conversion in A/D converter 111 is controlled by a control signal 120c. Analog samples of clamped signal component Y at terminal 110a are consecutively converted in A/D converter 111 to 8-bit words of an output signal 111a. The words of signal 111a are stored in a consecutive manner in a line memory 112. Line memory 112 operates, conceptually, as a first-in-first-out (FIFO) shift register.

The stored words of an output signal 111a are read out of line memory 112 at a rate that is double the rate by which the words of signal 111a are stored in line memory 112 to produce a signal 112a. Thus, the words of signal 112a are speeded up with respect to the words of signal 111a. Otherwise, signals 111a and 112a contain the same luminance information.

During a given horizontal line time H, the words of signal 111a are stored at the rate of 13.5 MHz in accordance with a write clock signal WCLK. Memory 112 is a dual port memory having a separate internal write address pointer, not shown, and a separate internal read address pointer, not shown. The write address pointer is initialized once in period H, at the beginning of horizontal period H by a signal WRES. The read address pointer is initialized twice in period H, both at the beginning and at the center of period H. The stored words of signal 111a are read out at twice the rate or 27 MHz in accordance with a read clock signal RCLK. During horizontal period H the words stored in memory 112 are read out twice, each read out begins after the read address pointer is initialized.

Assume that an entire video line is already stored in memory 112. Read out of memory 112 at double the write-in rate occurs when the first half of the next video line is stored in memory 112. Since memory 112 is a dual port memory, the write-in and the read-out can occur simultaneously. During the second read out of memory 112, the second half of the next video line is stored. Thus, two read-out cycles occur for each cycle of video line write-in.

Color signal component U is coupled via a coupling capacitor 113 to a multiplexer switch SMUX. Switch SMUX is controlled by a control signal 120b of unit 120. Similarly, color signal component V is coupled via a coupling capacitor 114 to multiplexer switch SMUX. Switch SMUX provides a multiplexer operation for applying alternate samples of signal components U and V to an output terminal 113a of multiplexer switch SMUX.

Because of the multiplexing action, the rate by which each of signal component U and V is developed at terminal 113a is one half the rate by which signal component Y is developed. The rate by which the combined samples are developed at terminal 113a from both signal components U and V is equal to that associated with signal component Y at terminal 110a. The bandwidth of each of signal component U and V is equal to one quarter of that of signal component Y. Thus, the sampling rate of signal component U or V, at one half that of signal component Y, is adequate.

A clamper switch S100 that may be realized using an MOS transistor, not shown, develops a DC voltage VC at terminal 113a, during interval t1, in a vicinity of horizontal sync signal SY, when each of signal components U and V is at its average value. Switch S100 is controlled by control signal 120b. When a sample of signal component U is coupled to terminal 113a via multiplexer switch SMUX and switch 100 is closed, clamper switch S100 develops a DC level shifting voltage in capacitor 113. Similarly, when signal component V is coupled to terminal 113a via multiplexer switch SMUX and switch S100 is closed, clamper switch S100 develops a DC level shifting voltage in capacitor 114. The result is that the average value of each of level shifted signal component U and V at terminal 113a is equal to voltage VC. The magnitude of voltage VC is selected to be in the middle of an input voltage range, 0V–1V, of A/D converter 115, or approximately 0.5V. Signal U, for example, at a terminal of capacitor 113 that is remote from terminal 113a has a peak-to-peak voltage range of 1V. Thus, the signal developed at terminal 113a has voltage swing limits of ±0.5V relative to its average value of 0.5V in a manner to prevent signal clipping. The average value of the signal developed at terminal 113a is developed in the vicinity of horizontal sync signal SY. Thus, each of signal component U and V is clamped to voltage VC at terminal 113a.

In carrying out an inventive feature, signal components U and V are multiplexed up-stream in the signal path of clamper switch S100. Thus, advantageously, clamper switch S100 that is disposed downstream in the signal path relative to multiplexer switch SMUX is shared for the clamping operation of each of signal components U and V. Advantageously, instead of using separate clampers for clamping each of signal components U and V separately, single switch S100 provides the clamping operation for both signal components U and V. In this way, the circuitry is simplified.

Samples of multiplexed and clamped signal components U and V at terminal 113a are applied to A/D converter 115. Similarly to A/D converter 111, A/D converter 115 produces a signal 115a having words that are stored in a line memory 116. Thus, alternate words of signal 115a are derived from signal components U and V and are stored consecutively in line memory 116. Line memory 116 operates similarly to line memory 112. The words of an output signal 116a of memory 116 are read out of line memory 116 at a rate that is double the rate by which the words of signal 115a are stored in line memory 116. Thus, signal 116a is speeded up with respect to signal 115a. Two read-out cycles occur for each cycle of video line write-in. Consequently, two speeded-up video lines occur for each video line of signal component U or V.

Signal 112a is read out and applied to a digital-to-analog (D/A) converter 117 that produces a speeded up luminance signal component Y(SU). Signal component Y(SU) is an analog, time-compressed signal relative to signal component Y. Otherwise, signal component Y(SU) contains the same luminance information derived from signal component Y.

A switch SDMUX applies alternate words of signal 116a, derived from signal components U and V, respectively, to D/A converter 117 for generating speeded-up signal components U(SU) and V(SU), respectively. Signal components U(SU) and V(SU) are analog, time-compressed signals. Otherwise, signal components U(SU) and V(SU) contain the same color information derived from signal components U and V, respectively. There are two consecutively occurring video lines of speeded-up signal components Y(SU), U(SU) and V(SU) for each video line of signal components Y, U and V, respectively.

What is claimed is:

1. A video apparatus for generating an analog, multiplexed video signal that is clamped, comprising:

a decoder responsive to said composite video signal for generating therefrom first and second video signal components that are separated from each other;

a multiplexer having an input that is responsive to said video signal components for alternately applying said first and second video signal components to an output of said multiplexer to develop said multiplexed video signal;

a source of a clamping signal; and a clamper responsive to said clamping signal for level shifting a first portion of said multiplexed video signal that is derived from said first video signal component and a second portion of said multiplexed video signal that is derived from said second video signal component to clamp said multiplexed video signal such that said clamper is located downstream in a signal path relative to said input of said multiplexer.

2. An apparatus according to claim 1 wherein each of said first and second video signal components is an analog signal, wherein said multiplexer applies said first and second signal components to a common output terminal of said multiplexer via first and second capacitors, respectively and wherein said clamper comprises a switch that couples a clamping voltage to each of said capacitors via said common output terminal for generating said multiplexed and clamped video signal at said common output terminal.

3. An apparatus according to claim 1 further comprising, a memory for storing said multiplexed and clamped video signal.

4. An apparatus according to claim 3 further comprising, an analog-to-digital converter responsive to said multiplexed and clamped video signal for generating a digital signal equivalent that is stored in said memory.

5. An apparatus according to claim 3 further comprising, a demultiplexer switch coupled to an output of said memory for separating from said stored video signal a signal that is derived from said first video signal component and a signal that is derived from said second video signal component.

6. An apparatus according to claim 3 wherein said stored video signal is read out of said memory at a higher clock rate than a clock rate utilized for storing said multiplexed and clamped video signal in said memory for generating a speeded-up video signal.

7. A video apparatus for generating a multiplexed video signal that is clamped, comprising:

a decoder responsive to said composite video signal for generating therefrom first and second video signal components that are separated from each other;

a multiplexer having an input that is responsive to said video signal components for alternately applying said first and second video signal components to said clamper to develop said multiplexed video signal, during a given video line time of each of said first and second video signal components; and a source of a clamping signal coupled to said clamper for clamping a first portion of said multiplexed video signal that is applied from said first video signal component and a second portion of said multiplexed video signal that is applied from said second video signal component such that said clamper is located downstream in a signal path relative to said input of said multiplexer.

* * * * *